(12) United States Patent
Hirata et al.

(10) Patent No.: US 9,714,651 B2
(45) Date of Patent: Jul. 25, 2017

(54) VIBRATING DEVICE AND PIEZOELECTRIC PUMP

(75) Inventors: Atsuhiko Hirata, Yasu (JP); Gaku Kamitani, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 12/761,467

(22) Filed: Apr. 16, 2010

(65) Prior Publication Data

US 2010/0196177 A1 Aug. 5, 2010

Related U.S. Application Data (63) Continuation of application No. PCT/JP2008/068724, filed on Oct. 16, 2008.

(30) Foreign Application Priority Data

Oct. 16, 2007 (JP) .................................. 2007-269328

(51) Int. Cl.
*F04B 43/00* (2006.01)
*F04B 43/04* (2006.01)
(Continued)

(52) U.S. Cl.
CPC ............ *F04B 43/04* (2013.01); *F04B 43/046* (2013.01); *H01L 41/0973* (2013.01); *F04B 45/027* (2013.01); *H01M 8/04201* (2013.01)

(58) Field of Classification Search
CPC .............................. F04B 43/046; F04B 45/047
(Continued)

(56) References Cited

U.S. PATENT DOCUMENTS 4,648,807 A * 3/1987 Tippetts et al. ............ 417/413.2
4,999,819 A    3/1991 Newnham et al.
(Continued)

FOREIGN PATENT DOCUMENTS

CN    101542830 A    9/2009
JP    2000-141644 A    5/2000
(Continued)

OTHER PUBLICATIONS

Machine Translation of JP 2006-100622.*
(Continued)

*Primary Examiner* — Charles Freay
*Assistant Examiner* — Christopher Bobish
(74) *Attorney, Agent, or Firm* — Keating & Bennett, LLP (57) ABSTRACT

A piezoelectric pump includes a piezoelectric element, an intermediate plate, and a vibrating plate. The piezoelectric element has a substantially flat plate shape. The intermediate plate is bonded to a principal surface of the piezoelectric element and applies a residual stress in a compressive direction to the piezoelectric element. The vibrating plate is bonded to the intermediate plate such that the vibrating plate faces a principal surface of the piezoelectric element and receives a residual stress in a compressive direction from the intermediate plate. In addition, the vibrating plate defines a portion of a wall surface of a pump chamber having an open hole. A fluid passage is provided in the piezoelectric pump. The fluid passage communicates with the outside of the chamber at one end thereof, and communicates with the pump chamber through the open hole at the other end.

8 Claims, 10 Drawing Sheets

(51) Int. Cl.
*H01L 41/09* (2006.01)
*F04B 45/027* (2006.01)
*H01M 8/04082* (2016.01)

(58) Field of Classification Search
USPC ............ 417/413.2, 410.2; 310/332, 330, 331
See application file for complete search history.

(56) References Cited

U.S. PATENT DOCUMENTS

| | | | |
|---|---|---|---|
| 5,089,739 A * | 2/1992 | Takahashi et al. | 310/328 |
| 5,589,725 A * | 12/1996 | Haertling | 310/358 |
| 5,834,882 A | 11/1998 | Bishop | |
| 5,849,125 A | 12/1998 | Clark | |
| 6,162,313 A | 12/2000 | Bansemir et al. | |
| 6,903,498 B2 * | 6/2005 | Unami et al. | 310/366 |
| 7,198,250 B2 * | 4/2007 | East | 251/129.06 |
| 7,585,044 B2 * | 9/2009 | Williams et al. | 347/19 |
| 7,830,311 B2 | 11/2010 | Kataya et al. | |
| 7,841,843 B2 * | 11/2010 | Cho | F04F 7/00 417/413.1 |
| 2002/0121843 A1 * | 9/2002 | Takeuchi et al. | 310/330 |
| 2002/0149296 A1 | 10/2002 | Fujii et al. | |
| 2005/0140743 A1 * | 6/2005 | Miyazawa et al. | 347/68 |
| 2006/0126296 A1 * | 6/2006 | Campbell et al. | 361/700 |
| 2009/0140197 A1 * | 6/2009 | Aoki et al. | 252/62.9 PZ |

FOREIGN PATENT DOCUMENTS

| | | |
|---|---|---|
| JP | 2000-332313 A | 11/2000 |
| JP | 2001-24460 A | 1/2001 |
| JP | 2001-260348 A | 9/2001 |
| JP | 2004-96225 A | 3/2004 |
| JP | 2004-146640 A | 5/2004 |
| JP | 2005-30213 A | 2/2005 |
| JP | 2006-100622 A | 4/2006 |
| JP | 2007-116091 A | 5/2007 |
| WO | 2006/009540 A1 | 1/2006 |
| WO | 2007/034903 A1 | 3/2007 |
| WO | 2008/069266 A1 | 6/2008 |

OTHER PUBLICATIONS

Partial Translation of JP2006-100622 (Takatsugi).*
Official Communication issued in International Patent Application No. PCT/JP2008/068724, mailed on Jan. 6, 2009.
Official Communication issued in corresponding Japanese Patent Application No. 2012-142612, mailed on Aug. 20, 2013.

* cited by examiner

VIBRATING DEVICE AND PIEZOELECTRIC PUMP

BACKGROUND OF THE INVENTION

1. Field of the Invention

The present invention relates to a vibrating device including a piezoelectric portion, such as a piezoelectric element, and more particularly, to a piezoelectric pump which conveys fluid by causing a vibrating plate which defines a wall surface of a pump chamber to vibrate using the piezoelectric portion.

2. Description of the Related Art

In general, a piezoelectric thin film is sensitive to tensile stress and easily breaks when a tensile stress is applied thereto. Accordingly, a technique to prevent the breakage of the piezoelectric thin film due to the tensile stress by applying a residual stress in a compressive direction is known (refer to, for example, Japanese Unexamined Patent Application Publication No. 2004-146640).

The piezoelectric thin film is formed on a substrate having a higher coefficient of linear expansion than that of the piezoelectric thin film in a heated environment. Then, when the piezoelectric thin film is cooled, the substrate contracts by a greater amount than the amount by which the piezoelectric thin film contracts. As a result, a residual stress in the compressive direction is applied to the piezoelectric thin film.

Figure 1A:
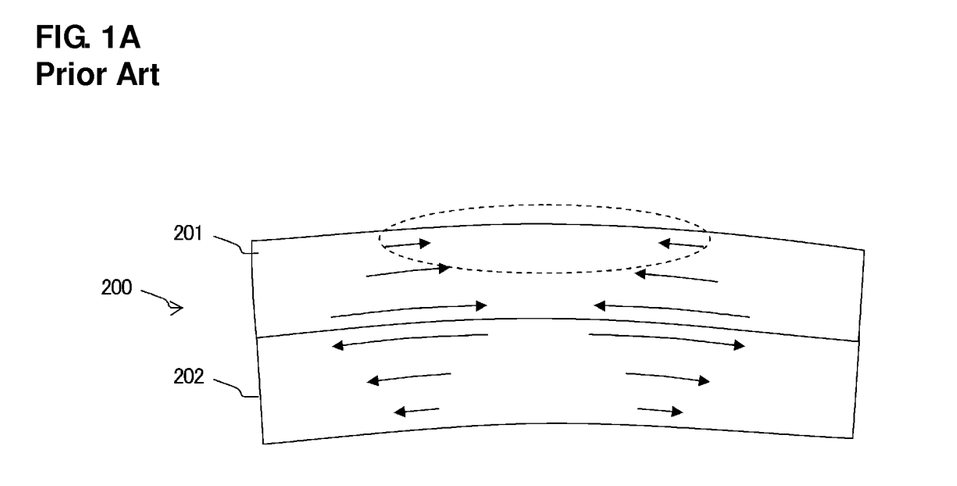
FIGS. 1A and 1B are diagrams illustrating a known structure.
Figure 1B:
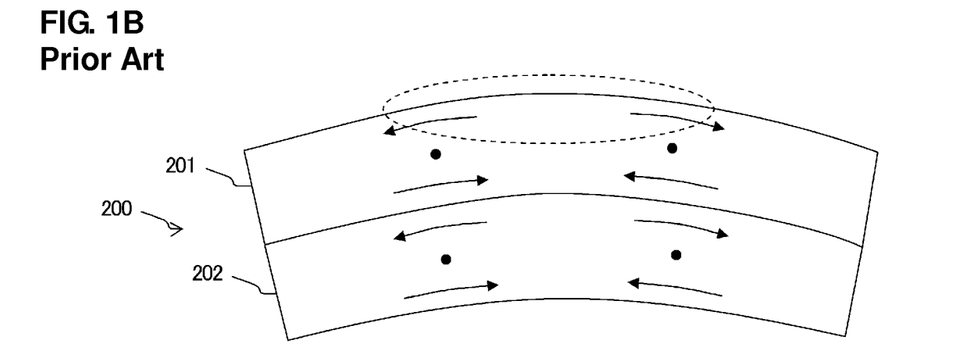

FIGS. 1A and 1B are sectional views of a piezoelectric thin film or a piezoelectric element in a known structure.

A structure 200 is obtained by thermally bonding a piezoelectric layer 201 to a substrate 202 and performing a cooling process after the thermal bonding process. FIG. 1A is a sectional view of the structure 200 in a static state after the cooling process. When the structure 200 is in this state, a residual stress in a tensile direction is applied to the substrate 202 and a residual stress in a compressive direction is applied to the piezoelectric layer 201. In this structure 200, since the residual stresses applied to the piezoelectric layer and the substrate are different from each other, the piezoelectric layer expands and the substrate contracts in the structure 200. As a result, the structure 200 slightly warps. Due to the expansion of the piezoelectric layer, there is a large residual stress gradient in the piezoelectric layer 201. The residual stress in the compressive direction is extremely small in an area near the surface of the piezoelectric layer 201.

The above-described piezoelectric element or the piezoelectric thin film may be used in a vibrating device or a piezoelectric pump which vibrates the piezoelectric element or the piezoelectric thin film by applying an alternating voltage thereto. In such a case, when the piezoelectric layer vibrates, the piezoelectric layer receives a tensile stress or a compressive stress.

FIG. 1B is a sectional view of the structure 200 in the state in which the structure 200 is bent to be convex on the piezoelectric-layer side due to the vibration. In the structure 200, since the residual stress in the compressive direction is applied to the piezoelectric layer 201 in advance, the tensile stress applied due to the vibration is reduced. However, since the piezoelectric layer 201 is initially warped and the residual stress in the compressive direction is extremely small in the area near the surface of the piezoelectric body, there is a risk that a crack will be formed in the surface of the piezoelectric body and the piezoelectric body will break.

In addition, in a piezoelectric pump in which a wall surface of a pump chamber is formed by a vibrating plate and the vibrating plate is vibrated by the piezoelectric element or the piezoelectric thin film to convey fluid in the pump chamber, there is a risk that the fluid cannot be conveyed if the piezoelectric layer breaks.

SUMMARY OF THE INVENTION

To overcome the problems described above, preferred embodiments of the present invention provide a vibrating device which prevents a piezoelectric layer from being warped and which reduces the risk that the piezoelectric layer will be broken by a tensile stress applied to the piezoelectric layer due to vibration, and a piezoelectric pump which reduces the risk that fluid cannot be conveyed.

A vibrating device according to a preferred embodiment of the present invention includes a piezoelectric portion, a first bonding portion, and a second bonding portion. The piezoelectric portion preferably has a substantially flat plate shape. The first bonding portion is preferably bonded to a principal surface of the piezoelectric portion and applies a residual stress in a compressive direction to the piezoelectric portion. The second bonding portion is preferably bonded to the first bonding portion such that the second bonding portion faces the piezoelectric portion, and receives a residual stress in the compressive direction from the first bonding portion. Alternatively, the second bonding portion is bonded to the piezoelectric portion such that the second bonding portion faces the first bonding portion, and applies a residual stress in the compressive direction to a bonding surface of the piezoelectric portion.

Thus, the residual stress in the compressive direction is applied to the piezoelectric portion. In the structure including the piezoelectric body, the first bonding portion, and the second bonding portion, residual stresses remain in a balanced state at both principal surfaces of the structure, so that warping of the structure is prevented. Therefore, the residual stress in the compressive direction is applied to a portion of the piezoelectric portion in an area near the surface thereof. Even when an alternating voltage is applied to the piezoelectric portion to cause vibration, the tensile stress applied to the piezoelectric portion due to the vibration can be canceled by the residual stress in the compressive direction which remains in the piezoelectric portion.

A piezoelectric pump according to a preferred embodiment of the present invention includes the above-described vibrating device and a pump body. A fluid passage is provided in the pump body, and the fluid passage extends from a pump chamber and communicates with the outside through an open hole. Preferably, the first bonding portion or the second bonding portion functions as a vibrating plate which defines a portion of a wall surface of the pump chamber. In such a case, the risk that the fluid cannot be conveyed due to breakage of the piezoelectric portion can be reduced.

A piezoelectric pump according to another preferred embodiment of the present invention includes a piezoelectric element, an intermediate plate, a vibrating plate, and a pump body. The piezoelectric element preferably has a substantially flat plate shape. The intermediate plate is bonded to a principal surface of the piezoelectric element and applies a residual stress in a compressive direction to the piezoelectric element. The vibrating plate is bonded to the intermediate plate such that the vibrating plate faces a principal surface of the piezoelectric element and receives a residual stress in the compressive direction from the intermediate plate. In addition, the vibrating plate defines a portion of a wall surface of a pump chamber having an open hole. A fluid passage is provided in the pump body. The fluid passage extends from the pump chamber and communicates with the outside through the open hole.

If the piezoelectric element, the vibrating plate, and the intermediate plate are bonded together in a heated environment, a compressive stress is applied to the piezoelectric element and the vibrating plate and a tensile stress is applied to the intermediate plate after a cooling process. Therefore, the residual stresses remain in the piezoelectric element and the vibrating plate in a balanced manner, and warping can be prevented after the cooling process. Consequently, the residual stress in the compressive direction that remains is applied to a portion of the piezoelectric portion in an area near the surface thereof. Therefore, even when an alternating voltage is applied to the piezoelectric portion to cause vibration, the tensile stress applied to the piezoelectric portion due to the vibration can be canceled by the residual stress in the compressive direction which remains in the piezoelectric portion.

A coefficient of linear expansion of the intermediate plate may preferably be greater than a coefficient of linear expansion of the vibrating plate and a coefficient of linear expansion of the piezoelectric element. In such a case, the residual stress in the compressive direction remains in a balanced manner in the area near the surface of the piezoelectric portion, and formation of cracks in the surface of the piezoelectric portion can be effectively prevented.

Preferably, a plurality of components of the pump body have the same or substantially the same coefficient of linear expansion, so that deformation of the components of the pump body due to temperature variation can be prevented. In such a case, a piezoelectric pump in which deformation due to temperature variation is small can be obtained.

In the structure including the piezoelectric element, the intermediate plate, and the vibrating plate, if the overall coefficient of linear expansion of the structure is less than the coefficient of linear expansion of the pump body, a residual stress in the compressive direction remains in the vibrating plate. In such a case, even if the vibrating plate is deformed due to temperature variation, no tensile stress is applied to the vibrating plate. Therefore, a piezoelectric pump in which deformation due to temperature variation is small can be obtained. In addition, leakage of vibration to the pump body does not readily occur and the pump efficiency increases.

According to various preferred embodiments of the present invention, the residual stresses remain in a balanced state so that warping of the structure can be prevented. As a result, a large residual stress in the compressive direction remains in the piezoelectric body. Therefore, even if a tensile stress is applied to the piezoelectric layer due to the vibration, the risk that the piezoelectric layer will break can be greatly reduced.

Other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A first preferred embodiment of the present invention in which a vibrating device according to a preferred embodiment of the present invention is included in a piezoelectric pump will be described.

Figure 2A:
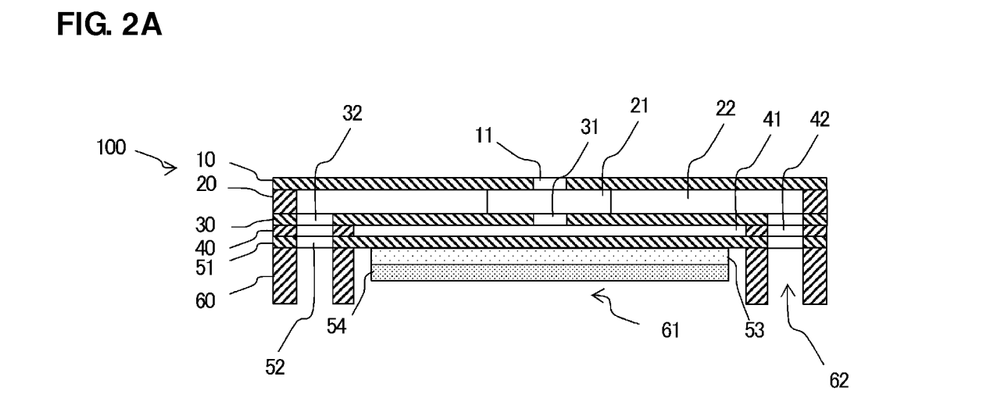
FIGS. 2A and 2B show sectional views of a piezoelectric pump according to a first preferred embodiment of the present invention.
Figure 2B:
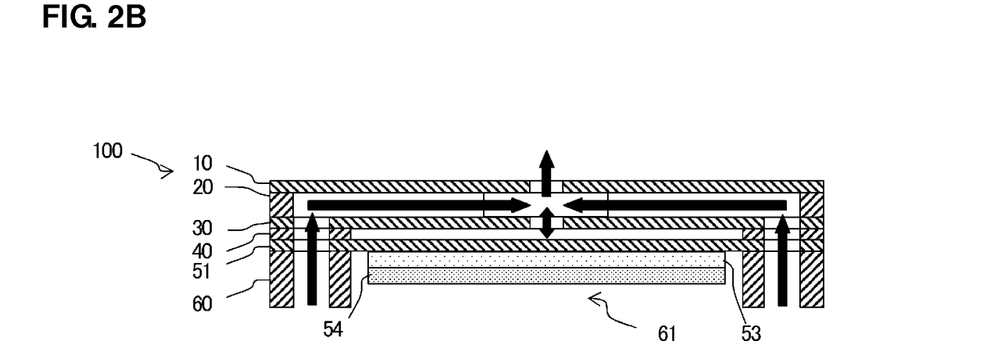

FIG. 2A is a sectional view of a piezoelectric pump 100 according to the first preferred embodiment. FIG. 2B is a diagram illustrating the manner in which fluid flows through the piezoelectric pump 100. In this preferred embodiment, an example of the structure of a piezoelectric pump used for air-cooling in an electronic device is described.

The piezoelectric pump 100 preferably includes a top plate 10, a flow-path plate 20, a pump-chamber top plate 30, a pump-chamber forming plate 40, a vibrating plate 51, an intermediate plate 53, a piezoelectric element 54, and a bottom plate 60. The vibrating plate 51, the intermediate plate 53, and the piezoelectric element 54 are thermally bonded together in advance preferably by applying thermosetting adhesive and heating the adhesive. Thus, a diaphragm structure 50, which will be described below, is provided. A portion of the piezoelectric pump 100 excluding the diaphragm structure 50 defines a pump body.

Figure 3:
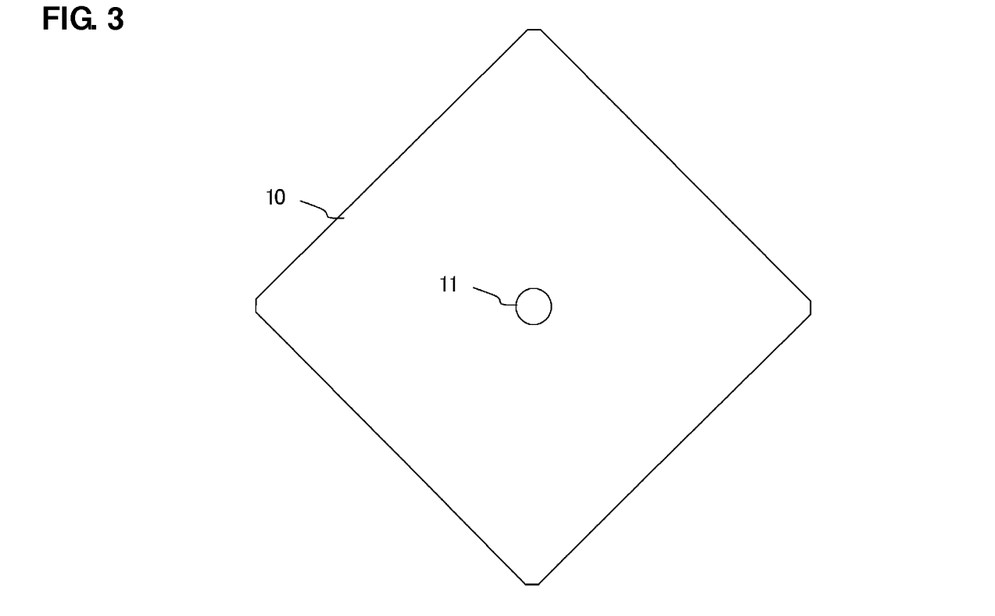
FIG. 3 is a plan view of a top plate included in the piezoelectric pump.

The top plate 10 includes an open hole 11, and is bonded to the flow-path plate 20. A plan view of the top plate 10 is shown in FIG. 3. The top plate 10 is preferably a flat or substantially flat plate having a rectangular or substantially rectangular external shape, and is preferably made of a rigid material, such as a cold rolled steel plate (SPCC), for example. The open hole 11 is provided at a central portion of the top plate 10. The open hole 11 communicates with the outside of the piezoelectric pump 100 and a flow-path central chamber 21 provided in the flow-path plate 20.

Figure 4:
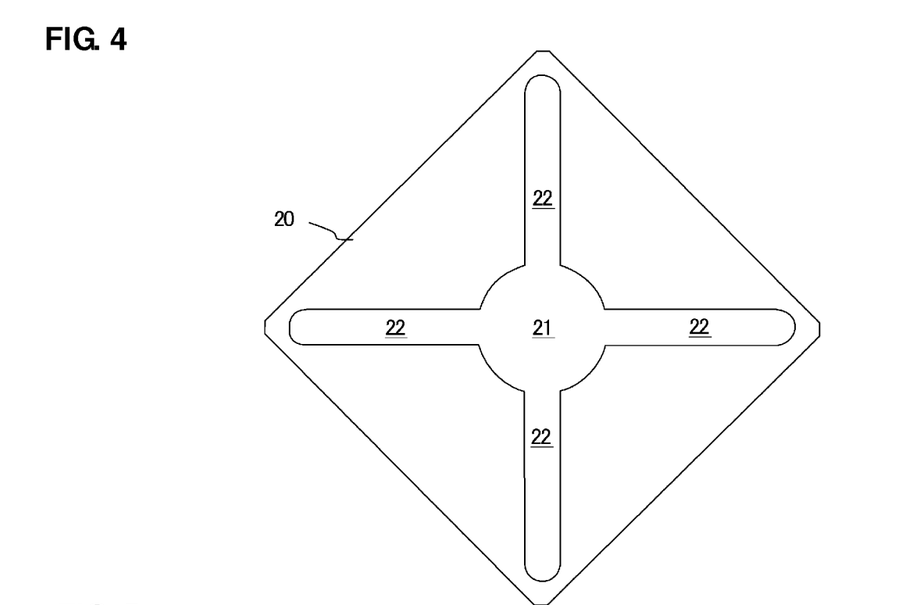
FIG. 4 is a plan view of a flow-path plate included in the piezoelectric pump.

The flow-path plate 20 is provided with the flow-path central chamber 21 and fluid passages 22, and is bonded to the top plate 10 and the pump-chamber top plate 30. A plan view of the flow-path plate 20 is shown in FIG. 4. The flow-path plate 20 is preferably a flat or substantially flat plate which has the same or substantially the same external shape as that of the top plate 10, and is preferably made of the same material as that of the top plate 10. The flow-path central chamber 21 is provided at a central portion of the flow-path plate 20, and four fluid passages 22 are provided so as to extend from the flow-path central chamber 21 toward the four corners of the flat plate. The flow-path central chamber 21 has a diameter that is greater than the diameter of the open hole 11, and communicates with the open hole 11 and an open hole 31 provided in the pump-chamber top plate 30. The fluid passages 22 communicate with the flow-path central chamber 21 and inlets 32 provided in the pump-chamber top plate 30. Since a plurality of fluid passages 22 communicate with the flow-path central chamber 21, the resistance at the fluid passages 22 is reduced and the gas is attracted to the flow-path central chamber 21. Therefore, the gas flow rate can be increased.

Figure 5:
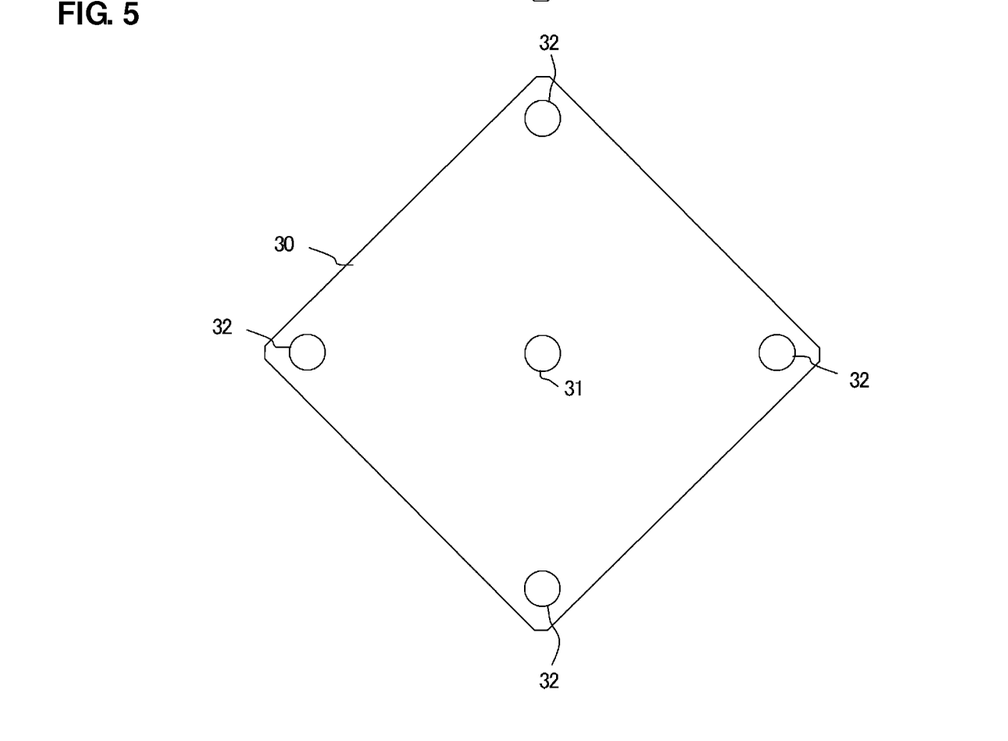
FIG. 5 is a plan view of a pump-chamber top plate included in the piezoelectric pump.

The pump-chamber top plate 30 is provided with the open hole 31 and inlets 32, and is bonded to the flow-path plate 20 and the pump-chamber forming plate 40. A plan view of the pump-chamber top plate 30 is shown in FIG. 5. The pump-chamber top plate 30 is preferably a flat or substantially flat plate which has the same or substantially the same external shape as that of the flow-path plate 20, and is preferably made of the same material as that of the flow-path plate 20. The open hole 31 is provided at a central portion of the pump-chamber top plate 30, and four inlets 32 are provided at the four corners of the flat plate. The open hole 31 and the open hole 11 have substantially the same diameter, and communicate with the flow-path central chamber 21 and a pump chamber 41 provided in the pump-chamber forming plate 40. In addition, the inlets 32 communicate with the fluid passages 22 and inlets 42 provided in the pump-chamber forming plate 40. Although the open hole 31 and the open hole 11 may have different diameters, the diameters are preferably less than the diameter of the flow-path central chamber 21. In addition, the pump-chamber top plate 30 may be made of a material different from that of the flow-path plate 20. For example, the pump-chamber top plate 30 may preferably be made of a material having spring elasticity.

Figure 6:
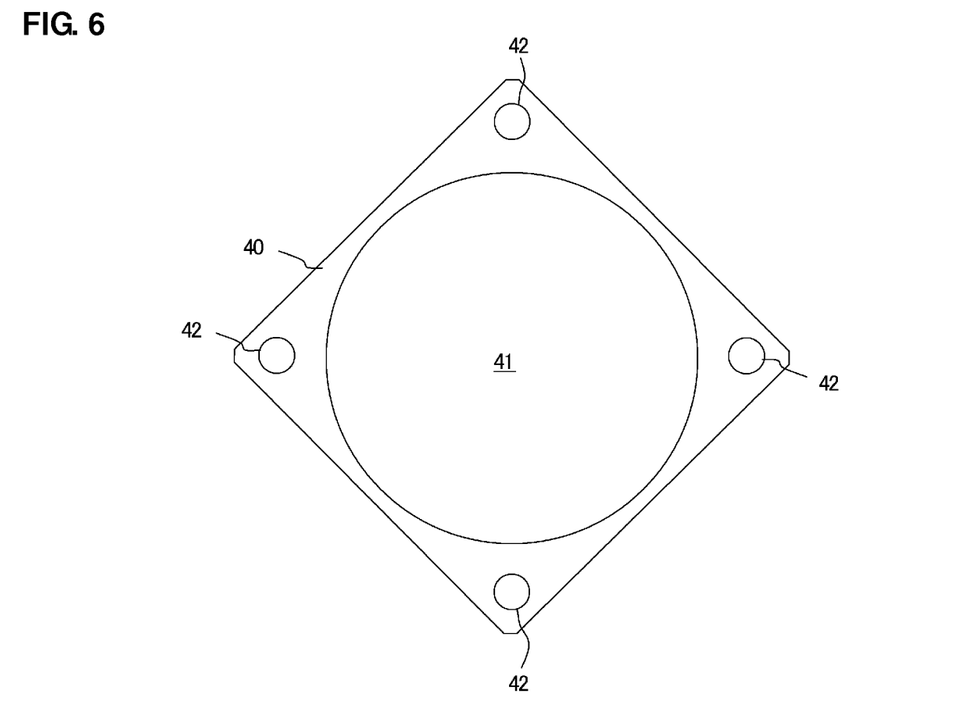
FIG. 6 is a plan view of a pump-chamber forming plate included in the piezoelectric pump.

The pump-chamber forming plate 40 is provided with the pump chamber 41 and the inlets 42, and is bonded to the pump-chamber top plate 30 and the vibrating plate 51. A plan view of the pump-chamber forming plate 40 is shown in FIG. 6. The pump-chamber forming plate 40 is preferably a flat or substantially flat plate which has the same or substantially the same external shape as that of the pump-chamber top plate 30, and is preferably made of the same material as that of the pump-chamber top plate 30. The pump chamber 41, which has a circular or substantially circular shape, is provided at a central portion of the pump-chamber forming plate 40, and four inlets 42 are provided at the four corners of the flat plate. The pump chamber 41 has a diameter that is greater than that of the flow-path central chamber 21, and communicates with the open hole 31. In addition, the inlets 42 communicate with the inlets 32 and inlets 52 provided in the vibrating plate 51.

Figure 7A:
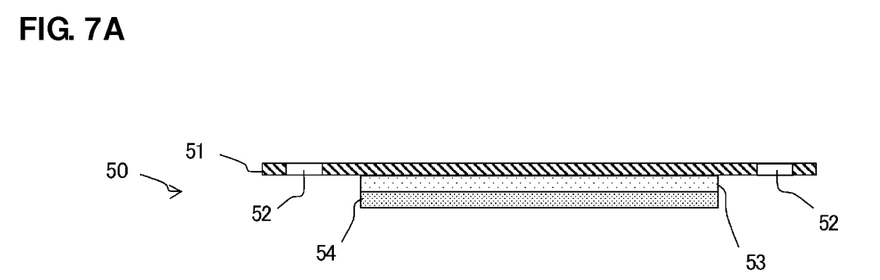
FIGS. 7A and 7B are diagrams illustrating a diaphragm structure included in the piezoelectric pump.
Figure 7B:
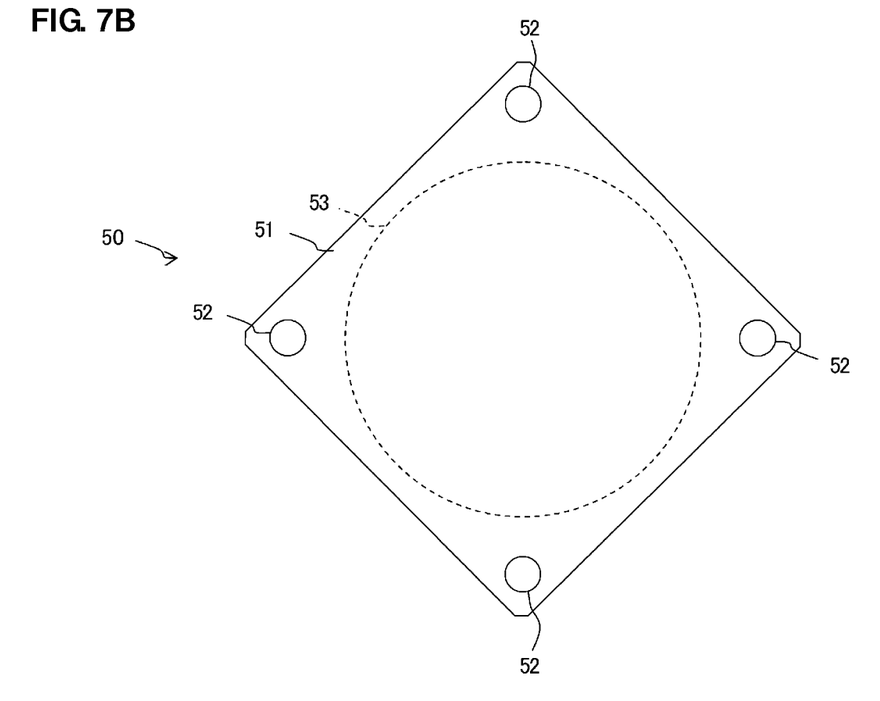

The intermediate plate 53 and the piezoelectric element 54 are bonded to the vibrating plate 51 in advance. More specifically, they are adhered together preferably by applying an adhesive and curing the adhesive by applying heat. The diaphragm structure 50 is defined by the above-mentioned components. A sectional view of the diaphragm structure 50 is shown in FIG. 7A, and a plan view of the diaphragm structure 50 is shown in FIG. 7B. The vibrating plate 51 is preferably a flat or substantially flat plate having the same or substantially the same external shape as that of the pump-chamber forming plate 40, and four inlets 52 are provided at the four corners of the flat plate. The vibrating plate 51 is bonded to the pump-chamber forming plate 40 and the bottom plate 60. The inlets 52 communicate with the inlets 42 and inlets 62 provided in the bottom plate 60. The intermediate plate 53 is preferably a flat or substantially flat plate having a circular external shape, and is thermally bonded to the vibrating plate 51 at a central portion thereof. The piezoelectric element 54 is preferably a flat or substantially flat plate having the same or substantially the same external shape as that of the intermediate plate 53, and is thermally bonded to the intermediate plate 53 at a central portion thereof.

Figure 8:
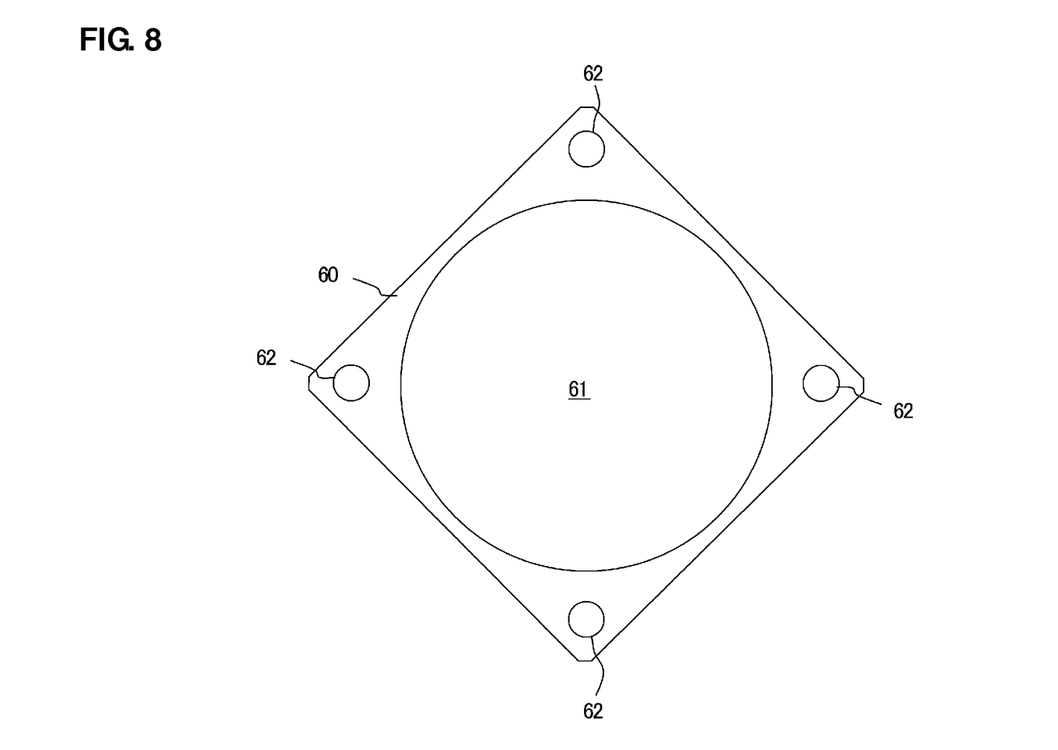
FIG. 8 is a plan view of a bottom plate included in the piezoelectric pump.

The bottom plate 60 is provided with a piezoelectric-element receiving section 61 and the inlets 62, and is bonded to the vibrating plate 51 in the diaphragm structure 50. A plan view of the bottom plate 60 is shown in FIG. 8. The bottom plate 60 is preferably a flat or substantially flat plate having the same or substantially the same external shape as that of the vibrating plate 51. The piezoelectric-element receiving section 61, which preferably has a circular or substantially circular shape, is provided at a central portion of the bottom plate 60, and four inlets 62 are provided at the four corners of the flat plate. The piezoelectric-element receiving section 61 accommodates the intermediate plate 53 and the piezoelectric element 54 in the diaphragm structure 50. The inlets 62 communicate with the inlets 52. The thickness of the bottom plate 60 is preferably greater than the sum of the thickness of the intermediate plate 53, the thickness of the piezoelectric element 54, and the amount of deformation of the piezoelectric element 54. Accordingly, the piezoelectric element 54 is prevented from coming into contact with a mounting board when the piezoelectric pump 100 is mounted to the surface of the mounting board.

The diaphragm structure 50 has a unimorph structure in which the piezoelectric element 54 is provided only on one side of the vibrating plate 51. The piezoelectric element 54 vibrates in an expansion vibration mode when an alternating voltage (sine wave or square wave) is applied to the piezoelectric element 54. Accordingly, the overall body of the diaphragm structure 50 is bent in a thickness direction thereof. In addition, the pump-chamber top plate 30 resonates in accordance with the bending of the diaphragm structure 50. As a result, the distance between the vibrating plate 51 and the pump-chamber top plate 30 changes and gas flows in and out of the pump chamber 41 through the open hole 31.

The alternating voltage is applied to the piezoelectric element 54 at a first-order resonance frequency or a third-order resonance frequency of the diaphragm structure 50. In this case, a volume variation caused by displacement components can be significantly increased as compared to the case in which an alternating voltage is applied at a frequency other than the first-order resonance frequency or the third-order resonance frequency. As a result, the flow rate can be greatly increased.

FIGS. 9A to 9E show sectional views of the main portion of the piezoelectric pump 100 illustrating the operation of the piezoelectric pump 100. In FIGS. 9A to 9E, the arrows show the flow of gas.

Figure 9A:
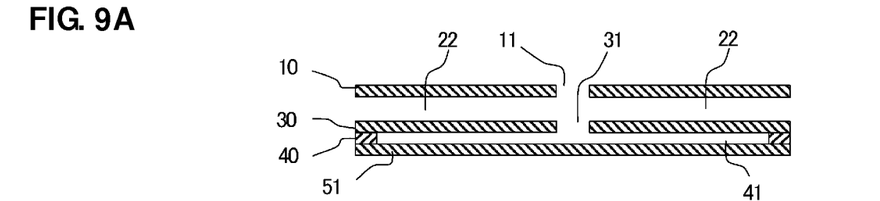
FIGS. 9A to 9E are diagrams illustrating the operation of the piezoelectric pump.

FIG. 9A shows the main portion in the state in which the alternating voltage is not applied to the piezoelectric element. In this state, the vibrating plate 51 is substantially flat.

Figure 9B:
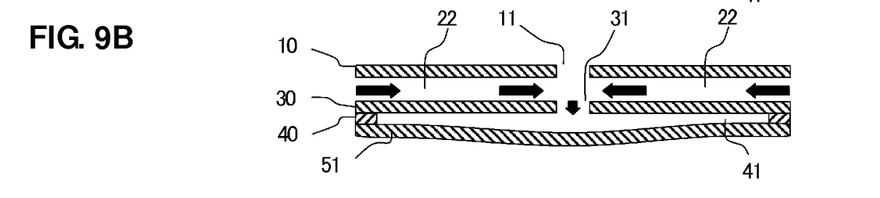

FIG. 9B shows the main portion in the state after the first quarter of a period of the alternating voltage. At this time, the vibrating plate 51 is bent so as to be downwardly convex. Therefore, the distance between the vibrating plate 51 and the open hole 31 in the pump chamber 41 increases so that the gas is sucked into the pump chamber 41 from the fluid passages 22 through the open hole 31.

Figure 9C:
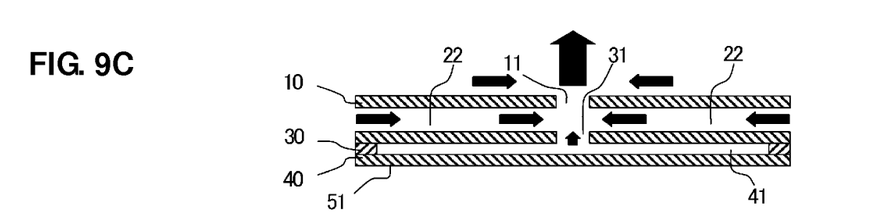

FIG. 9C shows the main portion in the state after the next quarter of the period. At this time, the vibrating plate 51 becomes flat again and the distance between the vibrating plate 51 and the open hole 31 in the pump chamber 41 decreases. Therefore, the gas in the pump chamber 41 is pushed out through the open holes 31 and 11. The gas in the fluid passages 22 is caused to flow together with the gas which flows out through the open hole 11, and the external gas which surrounds the open hole 11 is also caused to flow together with the gas which flows out through the open hole 11.

Figure 9D:
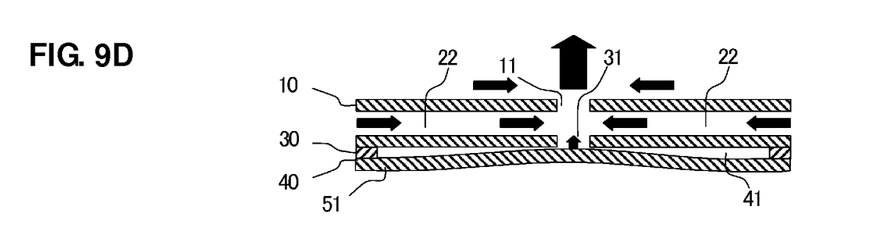

FIG. 9D shows the main portion in the state after the next quarter of the period. At this time, the vibrating plate 51 is bent to be upwardly convex, and the distance between the vibrating plate 51 and the open hole 31 in the pump chamber 41 further decreases. Therefore, the gas in the pump chamber 41 is pushed out through the open holes 31 and 11. The gas in the fluid passages 22 is caused to flow together with the gas which flows out through the open hole 11, and the external gas which surrounds the open hole 11 is also caused to flow together with the gas which flows out through the open hole 11.

Figure 9E:
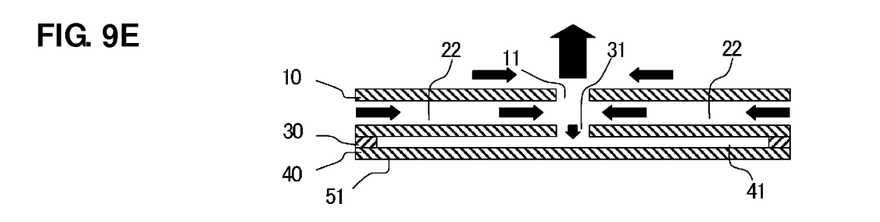

FIG. 9E shows the main portion in the state after the next quarter of the period. At this time, the vibrating plate 51 becomes flat again and the distance between the vibrating plate 51 and the open hole 31 in the pump chamber 41 increases. Since the volume increases, a portion of the gas which flows through the fluid passages 22 is sucked into the pump chamber 41 through the open hole 31. However, most of the gas which flows through the fluid passages 22 continuously flows out through the open hole 11 due to inertia thereof.

The above-described deformation of the vibrating plate 51 is periodically repeated. When the distance between the vibrating plate 51 and the open hole 31 in the pump chamber 41 increases, the gas is caused to flow into the pump chamber 41 through the flow-path central chamber 21, the fluid passages 22, the inlets 32, the inlets 42, the inlets 52, and the inlets 62. When the distance between the vibrating plate 51 and the open hole 31 in the pump chamber 41 decreases, the gas flows out of the piezoelectric pump through the pump chamber 41, the open hole 31, the flow-path central chamber 21, and the open hole 11. The piezoelectric element is vibrated at a high frequency so that the gas continuously flows out through the open hole 11 without stopping due to the inertia of the gas that flows through the fluid passages 22.

An example of the diaphragm structure 50 will now be described below with reference to FIG. 10.

The thickness of the piezoelectric element 54 is preferably about 0.2 mm, for example, and the coefficient of linear expansion thereof in a normal temperature (about 20° C. to about 30° C.) is preferably about $1 \times 10^{-6}$/K, for example. The piezoelectric element 54 vibrates when an alternating voltage is applied thereto. Preferably, the frequency of the alternating voltage is about 23 kHz and the amplitude of the alternating voltage is about ±5V (10 Vpp) to ±10 V (20 Vpp), for example.

The vibrating plate 51 is preferably made of Fe-42Ni alloy, for example. The thickness of the vibrating plate 51 is preferably about 0.08 mm, and the coefficient of linear expansion thereof in a normal temperature is preferably about $7 \times 10^{-6}$/K, for example.

The intermediate plate 53 is preferably made of SPCC, for example. The thickness of the intermediate plate 53 is preferably about 0.15 mm, and the coefficient of linear expansion thereof in a normal temperature is preferably about $11 \times 10^{-6}$/K, for example, which is greater than the coefficient of linear expansion of the piezoelectric element 54 and the coefficient of linear expansion of the vibrating plate 51.

The diaphragm structure 50 is preferably formed by bonding the piezoelectric element 54, the intermediate plate 53, and the vibrating plate 51 together by applying thermosetting adhesive and curing the adhesive by applying heat, for example. Therefore, the piezoelectric element 54, the intermediate plate 53, and the vibrating plate 51 are bonded together in a state in which each of them is thermally expanded.

The coefficient of linear expansion of the intermediate plate 53 is greater than the coefficient of linear expansion of the piezoelectric element 54 and the coefficient of linear expansion of the vibrating plate 51. Therefore, in a cooling process, the intermediate plate 53 tries to contract by a greater amount than an amount by which the piezoelectric element 54 and the vibrating plate 51 contract. Therefore, a residual stress in a compressive direction remains in each of the piezoelectric element 54 and the vibrating plate 51 and a residual stress in a tensile direction remains in the intermediate plate 53 after the cooling process.

Figure 10A:
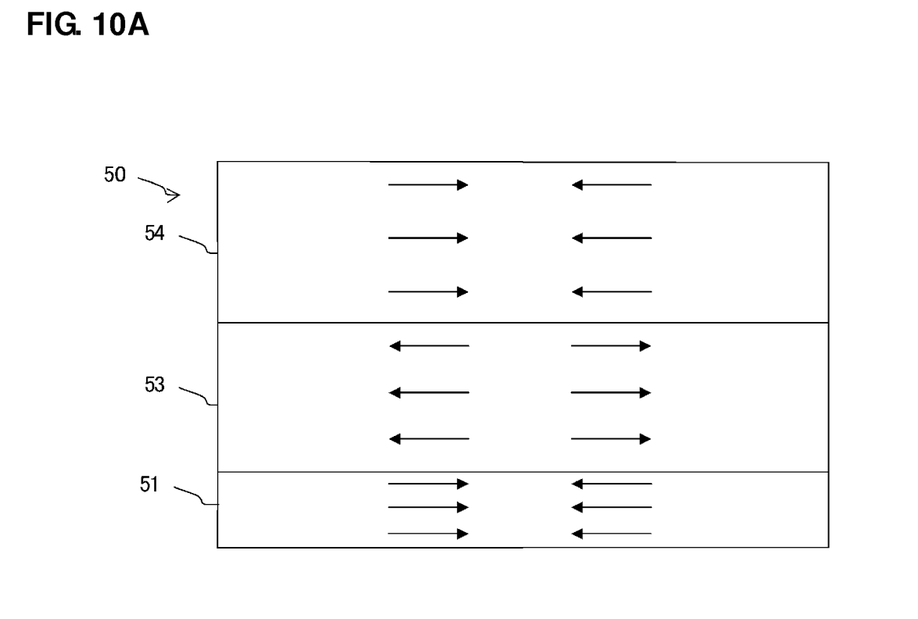
FIGS. 10A and 10B show sectional views of the diaphragm structure.

FIG. 10A is a partial sectional view of the diaphragm structure 50 in a static state.

When the diaphragm structure 50 is in this state, the residual stress in the tensile direction is applied to the intermediate plate 53. In addition, the residual stress in the compressive direction is applied to the piezoelectric element 54 and the vibrating plate 51. The residual stress in the compressive direction is applied at both sides of the intermediate plate 53, that is, in both the piezoelectric element 54 and the vibrating plate 51. Therefore, the residual stress remains in a balanced state. As a result, warping of the diaphragm structure 50 is prevented. Since warping of the diaphragm structure 50 is prevented, a large residual stress in the compressive direction also remains in an area near the surface of the piezoelectric element 54. Preferably, the coefficient of linear expansion of the piezoelectric element 54 and the coefficient of linear expansion of the vibrating plate 51 are close to each other, so that warping of the diaphragm structure 50 can be effectively prevented.

Figure 10B:
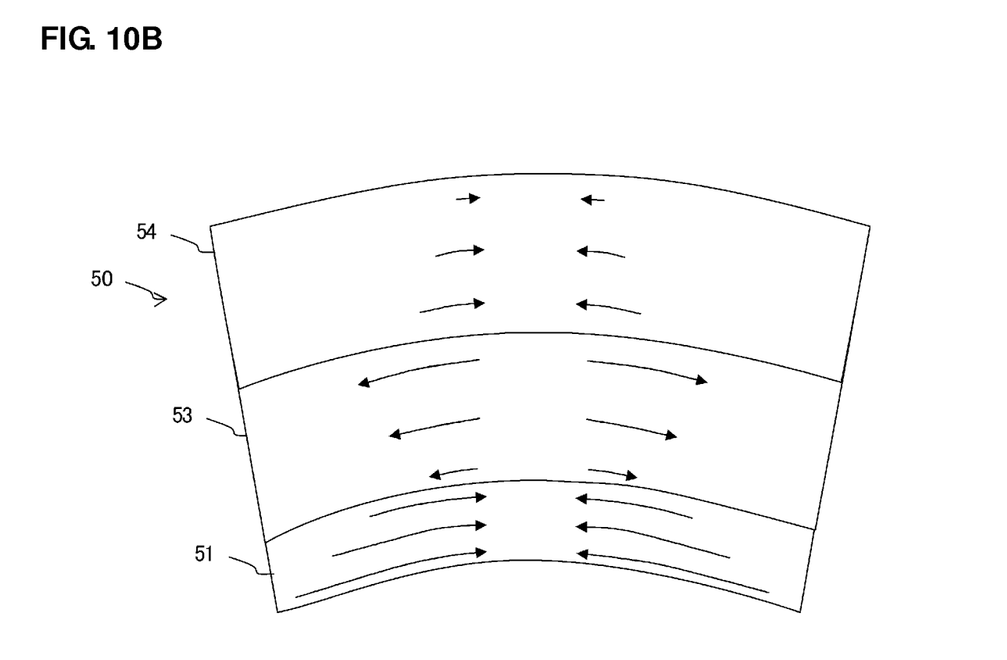

FIG. 10B is a partial sectional view of the diaphragm structure 50 in the state in which the diaphragm structure 50 is bent to be convex on the piezoelectric element side due to the application of the alternating voltage.

The diaphragm structure 50 vibrates when an alternating voltage is applied to the piezoelectric element 54 included in the diaphragm structure 50. Accordingly, a tensile stress or a compressive stress is applied to the piezoelectric element 54. In this diaphragm structure 50, warping of the diaphragm structure 50 does not significantly occur before the application of the alternating voltage. Therefore, a large residual stress in the compressive direction is applied to the piezoelectric element 54. Consequently, the tensile stress applied to the piezoelectric element 54 when it is bent can be canceled by the residual stress in the compressive direction, and the risk that the piezoelectric body will break can be reduced.

The heating temperature is set in accordance with the glass transition temperature of the thermosetting resin, and is preferably in the range of about 80° C. to about 150° C., for example. If the heating temperature is too high, there is a possibility that the bonding portion will become separated due to the thermal shock.

The coefficient of linear expansion of the vibrating plate 51 in the normal temperature is preferably in the range of about $1 \times 10^{-6}$/K to about $7 \times 10^{-6}$/K, for example, and the vibrating plate 51 may also be made of Fe-36Ni alloy or other suitable material instead of Fe-42Ni alloy. The coefficient of linear expansion of the intermediate plate 53 in the normal temperature is preferably in the range of about $11 \times 10^{-6}$/K to about $17 \times 10^{-6}$/K, for example, and the intermediate plate 53 may also be made of SUS430, SUS304, or other suitable material, instead of SPCC. The coefficient of linear expansion of the piezoelectric element 54 in the normal temperature is preferably in the range of about $1 \times 10^{-6}$/K to about $7 \times 10^{-6}$/K, for example, and the piezoelectric element 54 may also be made of PT or other suitable material other than PZT. If the coefficient of linear expansion of the intermediate plate 53 is excessively high as compared to those of the piezoelectric element 54 and the vibrating plate 51, there is a risk that the bonding portion will become separated due to the thermal shock.

The ratio of the thickness of the vibrating plate 51 to that of the piezoelectric element 54 is preferably in the range of about 0.4 to about 0.6, for example. If the thickness of the vibrating plate 51 is too small, the residual stress gradient in the piezoelectric element 54 will be excessively large. In such a case, sufficient residual stress in the compressive direction cannot be applied to the surface of the piezoelectric element 54. If the thickness of the vibrating plate 51 is too large, sufficient vibration amplitude cannot be obtained.

The ratio of the thickness of the intermediate plate 53 to that of the piezoelectric element is preferably in the range of about 0.5 to about 1.0, for example. If the thickness of the intermediate plate 53 is too small, sufficient residual stress in the compressive direction cannot be applied to the piezoelectric element 54, and the resonance frequency of the vibration of the diaphragm structure 50 decreases. If the thickness of the intermediate plate 53 is too large, the degree of resonance of the bending vibration of the diaphragm structure 50 becomes too high and sufficient amplitude cannot be obtained.

Preferably, components other than the diaphragm structure 50 are made of the same material. In such a case, deformation of the components of the piezoelectric pump 100 other than the diaphragm structure 50 can be prevented, and the thermal characteristic of the piezoelectric pump 100 can be reduced.

The coefficient of linear expansion of the overall body of the diaphragm structure 50 is preferably set to be less than the coefficient of linear expansion of the components other than the diaphragm structure 50. For example, the components of the piezoelectric pump 100 other than the diaphragm structure 500 may be made of the same material as that of the intermediate plate 53, so that the coefficient of linear expansion of the components is equivalent to that of the intermediate plate 53. In such a case, when the components are adhered to the diaphragm structure 50 and are heated, the components expand by a greater amount as compared to the amount by which the diaphragm structure 50 expands. Therefore, a residual stress in the compressive direction is applied to the vibrating plate 51 of the diaphragm structure 50. In such a case, even if the vibrating plate is deformed due to temperature variation, no tensile stress is applied to the vibrating plate. Therefore, a piezoelectric pump having a small temperature characteristic can be obtained.

Figure 11A:
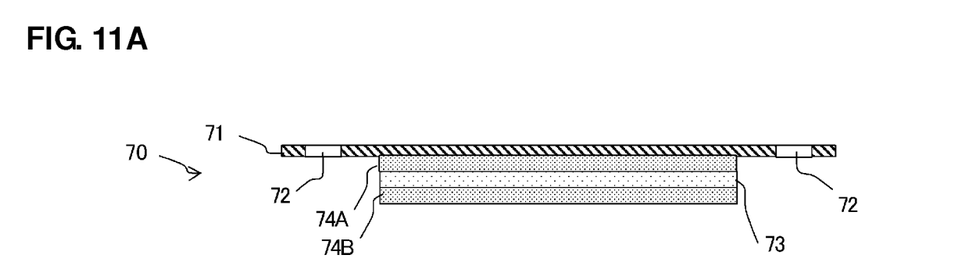
FIGS. 11A to 11C are diagrams illustrating other examples of a diaphragm structure of the piezoelectric pump.
Figure 11B:
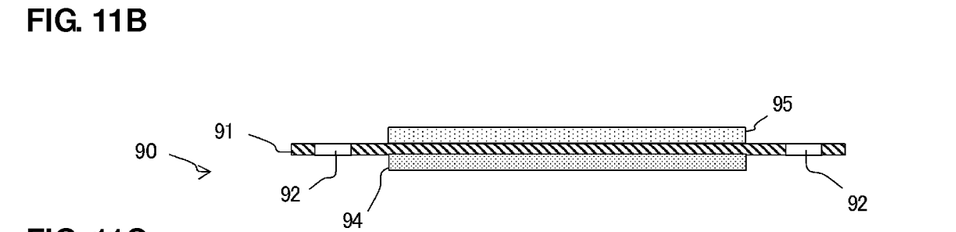
Figure 11C:
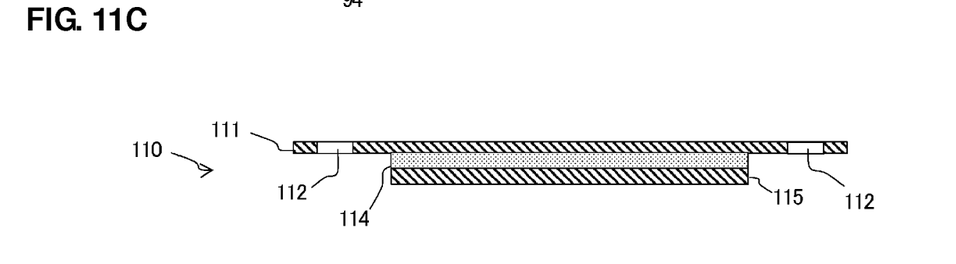

Next, diaphragm structures according to other preferred embodiments of the present invention that can be used in the piezoelectric pump will be described. FIGS. 11A to 11C show sectional views of the diaphragm structures.

FIG. 11A shows a diaphragm structure 70 including a vibrating plate 71, an upper piezoelectric element 74A, an intermediate plate 73, and a lower piezoelectric element 74B. The upper piezoelectric element 74A, the intermediate plate 73, and the lower piezoelectric element 74B preferably have the same or substantially the same shape, and the upper piezoelectric element 74A and the lower piezoelectric element 74B are preferably made of the same material. The intermediate plate 73 is preferably made of a material having a high coefficient of linear expansion, and the upper piezoelectric element 74A and the lower piezoelectric element 74B are preferably made of a material having a low coefficient of linear expansion. The vibrating plate 71 is preferably made of a material having a coefficient of linear expansion that is similar to that of the upper piezoelectric element 74A.

The vibrating plate 71, the upper piezoelectric element 74A, the intermediate plate 73, and the lower piezoelectric element 74B are adhered to each other with thermosetting adhesive and are thermally bonded together by curing the adhesive by applying heat.

Also in this structure, a residual stress in a tensile direction is applied to the intermediate plate 73 and a residual stress in a compressive direction is applied to the upper piezoelectric element 74A and the lower piezoelectric element 74B in the diaphragm structure 70. The residual stress in the compressive direction is applied at both sides of the intermediate plate 73, that is, in both the upper piezoelectric element 74A and the lower piezoelectric element 74B. Therefore, the residual stress remains in a balanced state. As a result, warping of the diaphragm structure 70 is prevented, and a large residual stress in the compressive direction also remains in areas near the surfaces of the piezoelectric elements 74A and 74B.

FIG. 11B shows a diaphragm structure 90 including a vibrating plate 91, a piezoelectric element 94, and a bonding portion 95. The piezoelectric element 94 and the bonding portion 95 preferably have the same or substantially the same shape. The bonding portion 95 is preferably made of, for example, Invar. The vibrating plate 91 is preferably made of a material having a high coefficient of linear expansion, and the piezoelectric element 94 and the bonding portion 95 are preferably made of a material having a low coefficient of linear expansion.

The vibrating plate 91, the piezoelectric element 94, and the bonding portion 95 are adhered to each other with thermosetting adhesive and are thermally bonded together by curing the adhesive by applying heat.

Also in this structure, a residual stress in a tensile direction is applied to the vibrating plate 91 and a residual stress in a compressive direction is applied to the piezoelectric element 94 and the bonding portion 95 in the diaphragm structure 90. The residual stress in the compressive direction is applied at both sides of the vibrating plate 91, that is, in both the piezoelectric element 94 and the bonding portion 95. Therefore, the residual stress remains in a balanced manner. As a result, warping of the diaphragm structure 90 is prevented, and a large residual stress in the compressive direction remains in an area near the surface of the piezoelectric element 94 and an area near the surface of the bonding portion 95.

FIG. 11C shows a diaphragm structure 110 including a vibrating plate 111, a piezoelectric element 114, and a bonding portion 115. The piezoelectric element 114 and the bonding portion 115 preferably have the same or substantially shape. The bonding portion 115 and the vibrating plate 111 are preferably made of the same material. The vibrating plate 111 and the bonding portion 115 are preferably made of a material having a high coefficient of linear expansion, and the piezoelectric element 114 is preferably made of a material having a low coefficient of linear expansion.

The vibrating plate 111, the piezoelectric element 114, and the bonding portion 115 preferably are adhered to each other with thermosetting adhesive and are thermally bonded together by curing the adhesive by applying heat.

The coefficient of linear expansion of the vibrating plate 111 and the coefficient of linear expansion of the bonding portion 115 are greater than the coefficient of linear expansion of the piezoelectric element 114. Therefore, the vibrating plate 111 and the bonding portion 115 try to contract by a greater amount than an amount by which the piezoelectric element 114 contracts in a cooling process. Therefore, after the cooling process, a residual stress in a compressive direction is applied to the piezoelectric element 114 and a residual stress in a tensile direction is applied to the vibrating plate 111 and the bonding portion 115. The piezoelectric element 114 has a bimorph structure obtained by adhering two piezoelectric plates to each other.

Figure 12A:
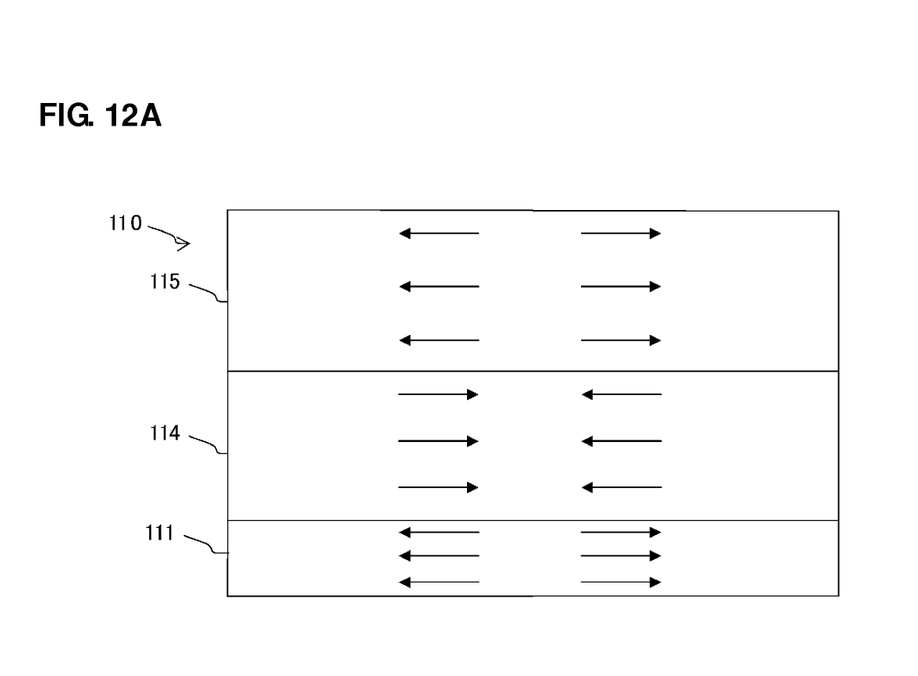
FIGS. 12A and 12B are diagrams illustrating the diaphragm structure.

FIG. 12A is a partial sectional view of the diaphragm structure 110 in a static state.

When the diaphragm structure 110 is in this state, the residual stress in the tensile direction is applied to the vibrating plate 111 and the bonding portion 115, and the residual stress in the compressive direction is applied to the piezoelectric element 114. The residual stress in the tensile direction is applied at both sides of the piezoelectric element 114, that is, in both the vibrating plate 111 and the bonding portion 115. Therefore, the residual stress remains in a balanced state. As a result, warping of the diaphragm structure 110 is prevented. Since warping of the diaphragm structure 110 is prevented, a large residual stress in the compressive direction also remains in the piezoelectric element 114. Preferably, the coefficients of linear expansion of the bonding portion 115 and the vibrating plate 111 are close to each other, so that warping of the diaphragm structure 110 can be effectively prevented.

Figure 12B:
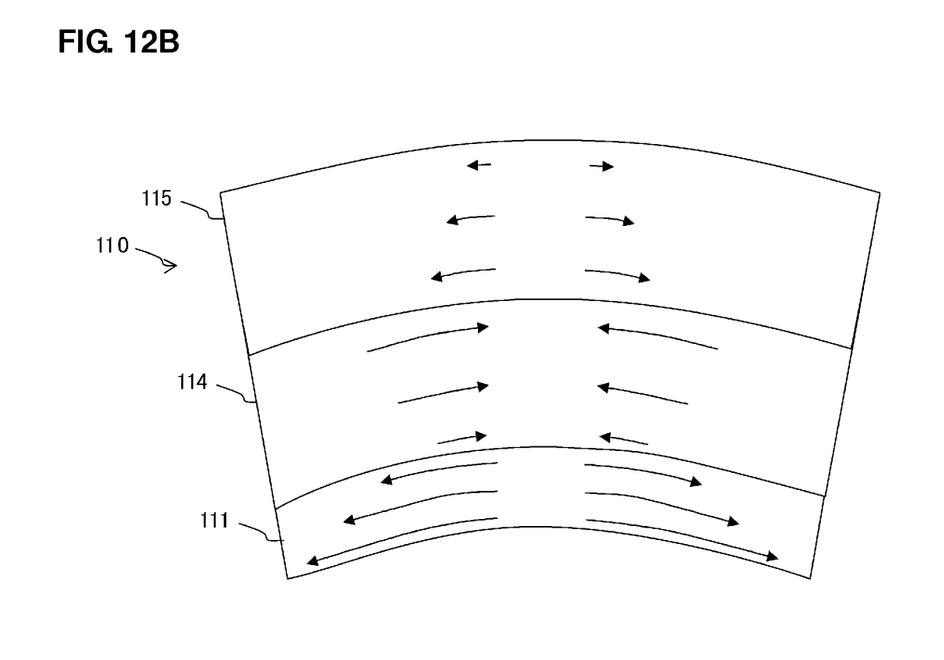

FIG. 12B is a partial sectional view of the diaphragm structure 110 in the state in which the diaphragm structure 110 is bent due to the alternating voltage applied thereto.

The diaphragm structure 110 vibrates when an alternating voltage is applied to the piezoelectric element 114 included in the diaphragm structure 110. Accordingly, a tensile stress or a compressive stress is applied to the piezoelectric element 114. In this diaphragm structure 110, warping of the diaphragm structure 110 does not readily occur before the application of the alternating voltage. Therefore, a compressive stress with a small gradient in the thickness direction of the piezoelectric element 54 remains in the piezoelectric element 54. Consequently, the tensile stress applied to the piezoelectric element 114 when it is bent can be canceled by the residual stress in the compressive direction, and the risk that the piezoelectric body will break can be reduced.

Although a piezoelectric pump used for air-cooling in an electronic device is described above, preferred embodiments of the present invention may also be applied to, for example, a pump for conveying gas, such as oxygen, to a fuel cell. Alternatively, preferred embodiments of the present invention may also be applied to a cooling-water conveying pump or a fuel conveying pump which conveys liquid. The structure of the piezoelectric pump is also not limited to the above-described structure, and the present invention may be applied to any type of piezoelectric pump as long as a wall surface of a pump chamber is defined by a vibrating plate included in a diaphragm structure.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A piezoelectric pump comprising:
a vibrating device comprising:
    a piezoelectric portion including a substantially flat plate having a circular or substantially circular external shape;
    a first bonding portion fixed to a principal surface of the piezoelectric portion, the first bonding portion being arranged to apply a residual stress in a compressive direction to a bonding surface of the piezoelectric portion; and
    a second bonding portion bonded to the first bonding portion such that the second bonding portion faces the piezoelectric portion, the second bonding portion being arranged to receive a residual stress in the compressive direction from the first bonding portion; and
a pump body including a pump chamber and a fluid passage provided therein, the fluid passage extending from the pump chamber and communicating with the outside through a first open hole provided in the pump body; wherein
the first bonding portion includes a vibrating plate which defines a portion of a wall surface of the pump chamber;
the vibrating plate extends to an outer periphery of the pump body; and
the pump body further includes a pump chamber top plate which defines another wall surface of the pump chamber, is opposed to the vibrating plate, and includes a second open hole therein which communicates with the fluid passage and the first open hole.

2. A piezoelectric pump comprising:
a vibrating device comprising:
    a piezoelectric portion including a substantially flat plate having a circular or substantially circular external shape;
    a first bonding portion fixed to a principal surface of the piezoelectric portion, the first bonding portion being arranged to apply a residual stress in a compressive direction to a bonding surface of the piezoelectric portion; and
    a second bonding portion bonded to the first bonding portion such that the second bonding portion faces the piezoelectric portion, the second bonding portion being arranged to receive a residual stress in the compressive direction from the first bonding portion; and
a pump body including a pump chamber and a fluid passage provided therein, the fluid passage extending from the pump chamber and communicating with the outside through a first open hole provided in the pump body; wherein
the second bonding portion includes a vibrating plate which defines a portion of a wall surface of the pump chamber;
the vibrating plate extends to an outer periphery of the pump body; and
the pump body further includes a pump chamber top plate which defines another wall surface of the pump chamber, is opposed to the vibrating plate, and includes a second open hole therein which communicates with the fluid passage and the first open hole.

3. A piezoelectric pump comprising:
a vibrating device comprising:
- a piezoelectric portion including a substantially flat plate having a circular or substantially circular external shape;
- a first bonding portion fixed to a principal surface of the piezoelectric portion, the first bonding portion being arranged to apply a residual stress in a compressive direction to a bonding surface of the piezoelectric portion; and
- a second bonding portion bonded to the piezoelectric portion such that the second bonding portion faces the first bonding portion, the second bonding portion being arranged to apply a residual stress in the compressive direction to a bonding surface of the piezoelectric portion; and a pump body including a pump chamber and fluid passage provided therein, the fluid passage extending from the pump chamber and communicating with the outside through a first open hole provided in the pump body; wherein the first bonding portion includes a vibrating plate which defines a portion of a wall surface of the pump chamber;

the vibrating plate extends to an outer periphery of the pump body; and the pump body further includes a pump chamber top plate which defines another wall surface of the pump chamber, is opposed to the vibrating plate, and includes a second open hole therein which communicates with the fluid passage and the first open hole.

4. A piezoelectric pump comprising:
a vibrating device comprising:
- a piezoelectric portion including a substantially flat plate having a circular or substantially circular external shape;
- a first bonding portion fixed to a principal surface of the piezoelectric portion, the first bonding portion being arranged to apply a residual stress in a compressive direction to a bonding surface of the piezoelectric portion; and
- a second bonding portion bonded to the piezoelectric portion such that the second bonding portion faces the first bonding portion, the second bonding portion being arranged to apply a residual stress in the compressive direction to a bonding surface of the piezoelectric portion; and a pump body including a pump chamber and a fluid passage provided therein, the fluid passage extending from the pump chamber and communicating with the outside through a first open hole provided in the pump body; wherein the second bonding portion includes a vibrating plate which defines a portion of a wall surface of the pump chamber;

the vibrating plate extends to an outer periphery of the pump body; and the pump body further includes a pump chamber top plate which defines another wall surface of the pump chamber, is opposed to the vibrating plate, and includes a second open hole therein which communicates with the fluid passage and the first open hole.

5. A piezoelectric pump comprising:
- a piezoelectric portion including a substantially flat plate having a circular or substantially circular external shape;
- an intermediate plate fixed to a principal surface of the piezoelectric portion, the intermediate plate being arranged to apply a residual stress in a compressive direction to the piezoelectric portion;
- a vibrating plate fixed to the intermediate plate such that the vibrating plate faces the principal surface of the piezoelectric portion, the vibrating plate being arranged to receive a residual stress in the compressive direction from the intermediate plate and to define a portion of a wall surface of a pump chamber;
- a pump body including the pump chamber and a fluid passage provided therein, the fluid passage extending from the pump chamber and communicating with the outside through a first open hole provided in the pump body; wherein the vibrating plate extends to an outer periphery of the pump body; and the pump body further includes a pump chamber top plate which defines another wall surface of the pump chamber, is opposed to the vibrating plate, and includes a second open hole therein which communicates with the fluid passage and the first open hole.

6. The piezoelectric pump according to claim 5, wherein a coefficient of linear expansion of the intermediate plate is greater than a coefficient of linear expansion of the vibrating plate and a coefficient of linear expansion of the piezoelectric portion.

7. The piezoelectric pump according to claim 6, wherein the pump body includes a plurality of components which are stacked together and which have substantially the same coefficient of linear expansion.

8. The piezoelectric pump according to claim 7, wherein the piezoelectric portion, the intermediate plate, and the vibrating plate define a structure having an overall coefficient of linear expansion that is less than a coefficient of linear expansion of the pump body.

* * * * *